United States Patent
Ito et al.

[11] Patent Number: 6,030,729
[45] Date of Patent: Feb. 29, 2000

[54] LIGHT EXPOSURE MASK

[75] Inventors: Shinichi Ito; Kenji Kawano, both of Yokohama; Satoshi Tanaka, Kawasaki, all of Japan

[73] Assignee: Kabushiki Kaisha Toshiba, Kawasaki, Japan

[21] Appl. No.: 09/079,170

[22] Filed: May 15, 1998

[30] Foreign Application Priority Data

May 19, 1997 [JP] Japan .................................. 9-128666

[51] Int. Cl.[7] ...................................................... G03F 9/00
[52] U.S. Cl. ................................................................ 430/5
[58] Field of Search ................................ 430/5, 323, 313, 430/322

[56] References Cited

U.S. PATENT DOCUMENTS

| 5,409,789 | 4/1995 | Ito | 430/5 |
| 5,536,604 | 7/1996 | Ito | 430/5 |
| 5,631,109 | 5/1997 | Ito | 430/5 |
| 5,674,647 | 10/1997 | Isao et al. | 430/5 |
| 5,908,718 | 6/1999 | Ishida et al. | 430/5 |

*Primary Examiner*—S. Rosasco
*Attorney, Agent, or Firm*—Finnegan, Henderson, Farabow, Garrett & Dunner, L.L.P.

[57] ABSTRACT

Attention is paid to the shifting of a focal point depth due to an interference between some light penetrating even a light shielding film, that is, a light shielding film having a nonzero transmittance, and light passing through an opening. Study has been made about how both the transmittance of the light shielding film and the phase difference between the light penetrating the light shielding film and light passing through a light transmitting medium the same in thickness as the light shielding film vary, arriving at a conclusion that the broadest focal point tolerance can be obtained if a phase difference of substantially $n \cdot \pi$ (n: an positive integer) exists between light penetrating the light shielding film and light passing through the light transmitting medium.

14 Claims, 7 Drawing Sheets

LIGHT EXPOSURE MASK

BACKGROUND OF THE INVENTION

The present invention relates to a light exposure mask for use in a lithography step of a semiconductor manufacturing process and, in particular, a light exposure mask having a phase shift pattern.

Further, the present invention relates to a substrate for forming an exposure mask and a method for forming this light exposure mask.

With a recent advance in the semiconductor technique a semiconductor device or element has been so advanced as to offer a high-speed device of a high integration density. These recent advances have resulted in an ever-increasing need for very fine patterning of semiconductor devices and elements, and for patterns having very small configurations and high integration densities.

In order to satisfy such a need, the light of a short wavelength such as far-ultraviolet light has been used as an exposure light source. In recent years, attempts have been made to achieve such a microminiaturization without changing an exposure light source. As one technique there is known a phase shifting method. This phase shifting method comprises forming, at a light transmitting section, partially a phase inversion layer for allowing an optical path length to be delayed by $\lambda/2$ and, by doing so, eliminating any adverse effect caused by the diffraction of light produced between adjacent patterns and hence achieving an enhanced pattern accuracy.

Of the phase shifting method there is known an alternative phase shifting method for improving an image resolution in particular. In this technique, as shown in FIG. 1A, a light shielding film 102 with openings (light transmitting sections) provided therein is formed on a light transmitting substrate 101 in a manner to provide a phase shifter 103 in one of the adjacent openings and not in the other. The phase of the light passing through the phase shifter 103 is 180° inverted relative to the light passing through the section where the phase shifter 103 is not provided. Through the phase inversion of the light rays in the adjacent openings, a negative interference occurs between the adjacent light rays, thus improving a resolution performance.

The alternative phase shift mask can also be provided in a manner to form one (for example, 105) of adjacent openings 104, 105 as a groove in a substrate 101 relative to the other as shown in FIG. 1B. In this structure, even if these openings 104, 105 have the same dimension, there arises the problem of producing a difference in light intensity between the opening (groove) in the substrate and the other opening on the substrate, that is, between a phase shift section 105 and a non-phase shift section 104. Namely, through an interference between the edges of a pattern located substantially parallel to an optical axis an opening size is optically narrowed at the phase shift section 105.

In order to solve this problem, a proposal has been made to provide both adjacent openings 106 and 107 as grooves in a substrate as shown in FIG. 1C, so that it is possible to achieve a uniform light intensity through an interference at the edges of a pattern between the openings.

In FIG. 1C, a chromium compound is principally used as a light shielding film 102. The composition of this compound is adjusted, when in use, so as to reveal the light shielding property not only in an exposure light wavelength range but also in a range below a visible area. In order to allow light rays which transmit one (first groove) of the openings 106, 107 and the other (second groove) to be set in a phase inversion relation, amounts of cut in the openings (grooves) are adjusted. The difference in amounts of cut in the first and second grooves 106 and 107 is set as an optical path length difference so that it is made equal to substantially one half the exposure light wavelength $\lambda$ (phase shift thickness). Further, the amount of cut (bias amount) in the shallower groove is so set as to be substantially equal to the difference in cut amounts between the grooves 106 and 107.

However, this type of exposure light mask involves the following problem. That is, the existing light shielding film, being light-shielding in property, has its light intensity transmittance not made zero and has a transmittance of 0.01 to 0.1%. This phenomenon will occur so long as the extinction coefficient of the light shielding film is not infinite.

FIG. 2 shows a focal point tolerance found from an optical image of an alternative pattern in the case where, as the light shielding film, use is made of a light shielding film of 0.1% transmittance whose optical path length of light passing therethrough is lengthened by $\lambda/4$ (has a phase difference of 90°) compared with an adjacent medium having the same thickness as that of the light shielding film. By the focal point tolerance is meant an ordinary term defined by a range in which the forward/backward shifting of the focal point is allowable under a precision limit (the tolerance of the pattern dimension).

The target pattern dimension was 0.15 $\mu$m and the phase difference of the adjacent openings at the substrate was 180°. In FIG. 2, the abscissa represents an exposure light amount (dose) in logarithm and the ordinate a defocus amount. The precision limit was set to be ±10% with respect to a desired value.

Here, a curve 201 represents the exposure light amount against the defocus amount in the case where the dimension varies in a range of ±10% against light passing through a substrate surface. Similarly, a curve 202 represents a similar exposure light amount (dose) of a 180° phase pattern adjacent to a pattern with a substrate surface defined as an opening. An area defined by these curves 201 and 202 shows an area falling within ±10% of a desired dimension.

In the alternative phase shift mask, if the transmittance of the light shielding film is set to be zero, those curves corresponding to the two openings are completely superimposed with respect to each other as shown in FIG. 3 (see the curve 301). In FIG. 2, the failure of the curves 201 and 202 to be superimposed with respect to each other is because the light shielding film has a transmittance and a phase involved.

Here, consideration is paid to a variation in sensitivity of a resist, illumination spots by the light exposure device, and so on, and their variation values are set to be 10% (the dose variation conversion values). An area satisfied even if the line width variation amount as set out above produces this dose variation conversion value is represented by a black frame 203 in FIG. 2 and a black frame 203 in FIG. 3. In the case where the phase of the light shielding film was 90° as in FIG. 2, there occurred a 30% fall in depth of focus in comparison of 0% in light intensity transmittance of the light shielding film.

The following is a table on data at respective wavelengths of the heretofore used light shielding film material (CrOx/Cr), that is, data on a refractive index, an extinction coefficient and a film thickness and a consequent transmittance, phase relation and deterioration in depth of focus in the case where this film is applied to an alternative phase shift mask.

TABLE

| | Cr film | | | CrOx film | | | | | deterioration in focal point tolerance |
|---|---|---|---|---|---|---|---|---|---|
| wavelength | refractive index | extinction factor | film-thickness (nm) | refractive index | extinction factor | film thickness (nm) | transmittance (%) | phase (°) | |
| 248 nm | 1.62 | 1.75 | 700 | 2.04 | 0.94 | 300 | 0.051 | 98.69 | 23% |
| 365 nm | 1.85 | 2.38 | 700 | 2.34 | 0.81 | 300 | 0.151 | 86.00 | 43% |
| 193 nm | 1.85 | 2.75 | 700 | 2.73 | 0.71 | 300 | 0.242 | 79.82 | 52% |

From this Table it is found that, for any wavelength, the phase difference is not adjusted and has a value near to 90°. In the case where, for these wavelengths, respective light shielding films were applied to the alternative phase shift mask, a prominent degeneration occurred in terms of the depth of focus.

In this way, although, in the conventional alternative phase shift mask, the transmittance of the light shielding film is dealt with as 0, it has about a 0.1% (OD=3) in actuality and it has, therefore, not been possible to achieve a performance inherent to the alternative phase shift method. When, in particular, the phase difference between the light passing through the light shielding film and the light passing through a light transmitting medium of a corresponding thickness was 90°, the focal point was found to be largely narrowed.

BRIEF SUMMARY OF THE INVENTION

It is accordingly the object of the present invention to provide an alternative light exposure method which can make the focal point tolerance broader.

The inventors, paying attention to the fact that the depth of focus is shifted due to an interference between some light passing through a light shielding film, though being not zero in transmittance, that is, some light penetrable/leakable through even the light shielding film, and the light passing through an opening, have further studied how the transmittance of the light shielding film, as well as the phase difference between some light penetrating even the light shielding film and light passing through a light transmitting medium of a corresponding film thickness, influences the focal depth in any specific variation. As a result, the inventors have been found that if there exists a phase difference of substantially $n \cdot \pi$ (n=a positive integer) between some light penetrable/leakable through even the light shielding film and the light passing through the light transmitting medium equal in thickness to the light shielding film, the tolerance of the focal point can be made the broadest. It is, therefore, possible to reduce any adverse effect resulting from some light penetrable/leakable through the light shielding film and to derive the alternative light exposure mask's own performance.

Further it has also been found that the same performance can be achieved by setting the phase difference in a range of $n \cdot \pi \pm 40°$ in the case of the transmittance of the light shielding film being below 0.1% and by setting the phase difference in a range of $n \cdot \pi \pm 20°$ in the case of the transmittance of the light shielding film being below 0.08%.

Further, in the case where the transmittance of the light shielding film can be made adequately as small as below 0.007%, it was possible to obtain an adequately broader tolerance of a focal point irrespective of the phase difference of the light shielding film. In this case, even if the phase difference of the light shielding film is $(n+\frac{1}{2}) \cdot \pi$ as in the prior art, the tolerance of the focal point cannot be narrowed. It is only necessary to set only the transmittance in a range below 0.007% without considering the phase difference relating to the light shielding film and it is possible to increase the freedom with which the light shielding film material is selected.

Thus according to the present invention it is possible to suppress the narrowing of the focal point tolerance resulting from some light penetrable/leakable through the light shielding film and to exhibit performance inherent to the alternative phase shift method, etc.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinbefore.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1A:
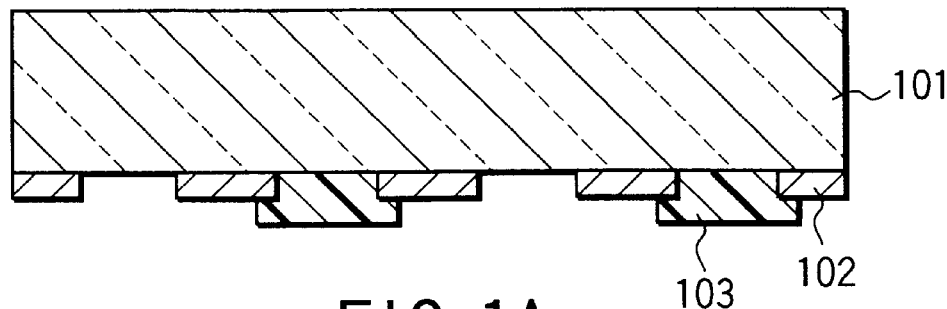
FIGS. 1A, 1B to 1C are cross-sectional views showing three kinds of conventional typical alternative masks (with phase shifter)
Figure 1B:
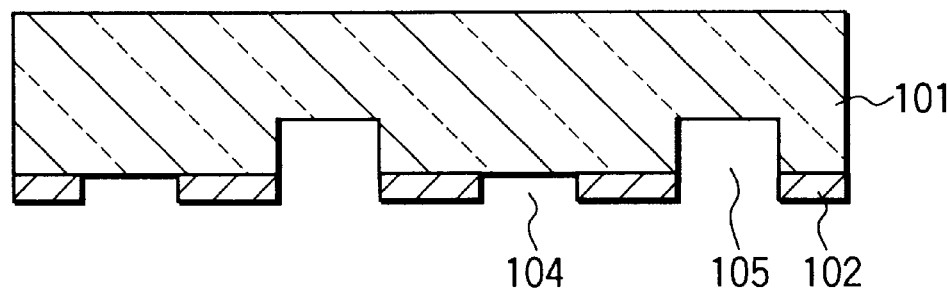
Figure 1C:
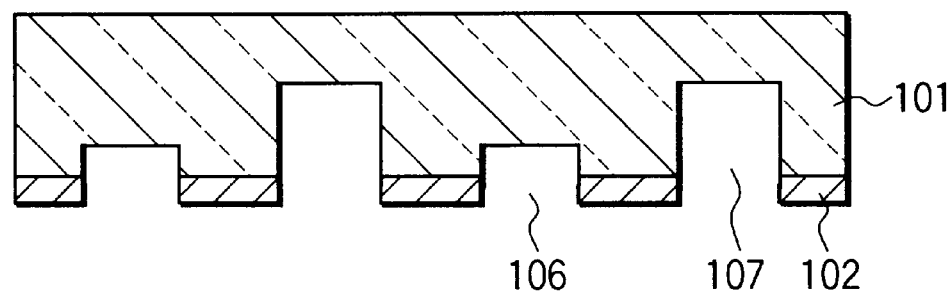
Figure 2:
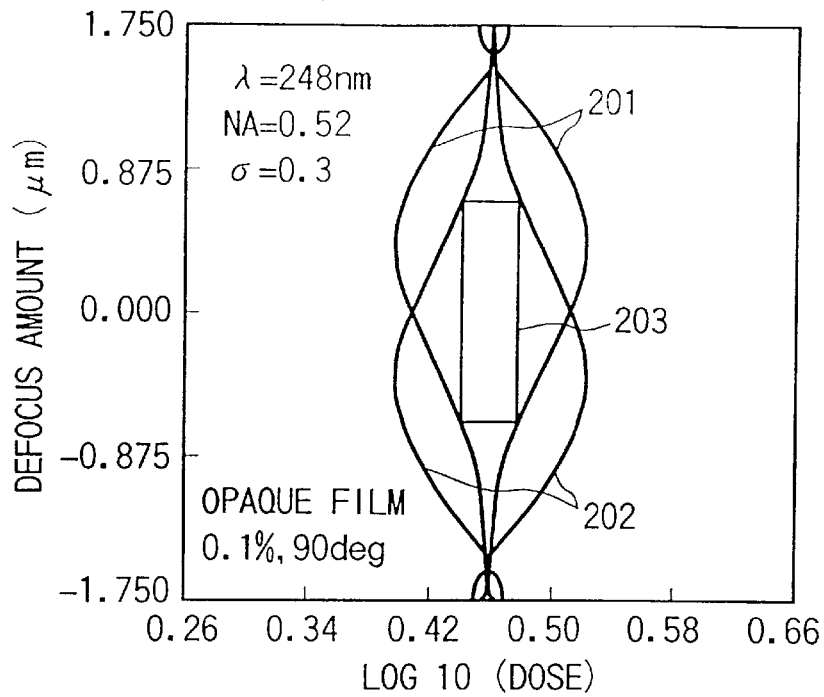
FIG. 2 shows a focal point tolerance when a phase difference between some light penetrable/leakable through even a light shielding film and a light transmitting medium (the atmosphere) of a corresponding thickness is 90°.
Figure 3:
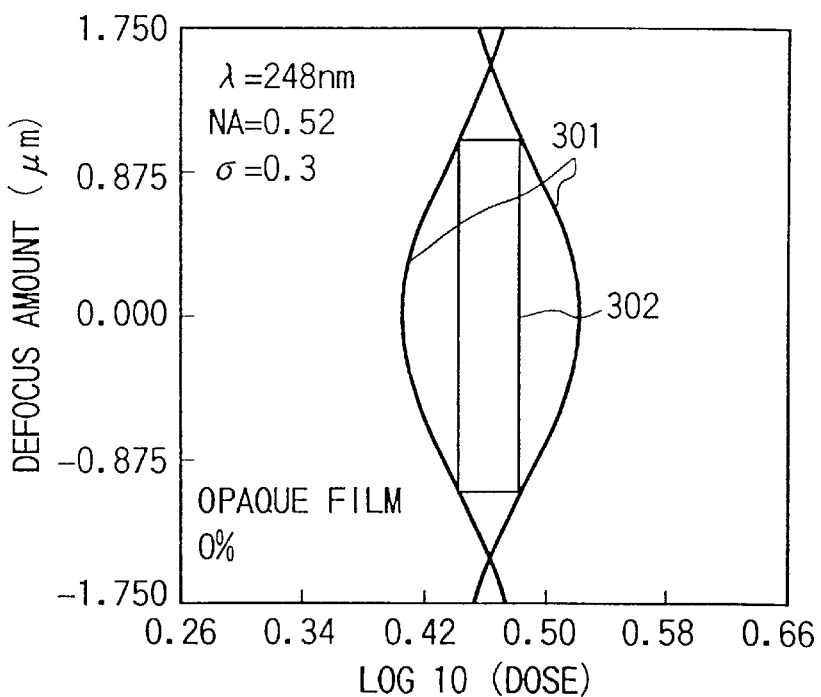
FIG. 3 is a view showing a focal point tolerance when the transmittance of the light transmitting film is 0%.
Figure 4A:
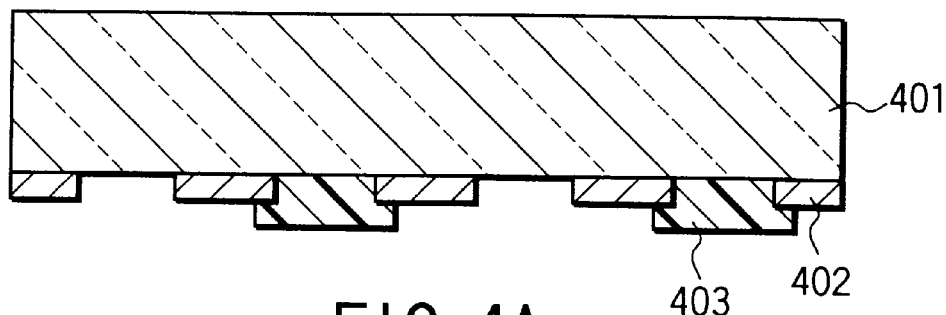
FIGS. 4A, 4B and 4C are cross-sectional views showing three kinds of alternative masks according to the present invention.
Figure 4B:
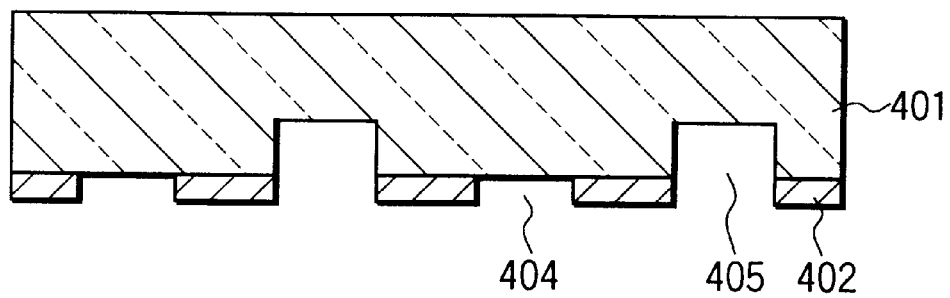
Figure 4C:
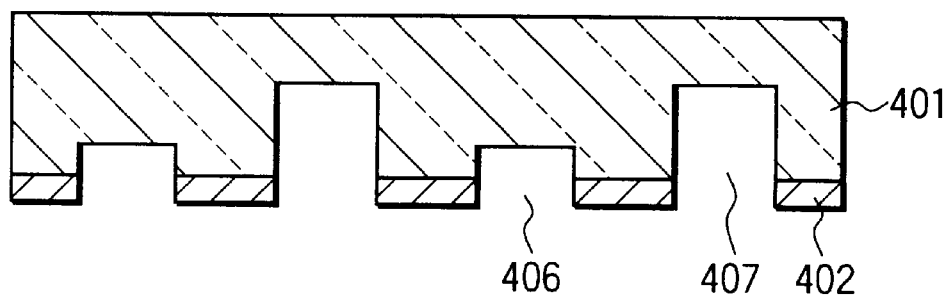

A preferred embodiment of the present invention will be explained below with reference to the accompanying drawing. The present invention can be applied to any kinds of alternative light exposure masks. FIGS. 4A, 4B and 4C show three kinds of typical alternative light exposure masks. FIG. 4A shows one kind of alternative mask in which light shielding films 402 are formed on a light transmitting substrate 401 in a manner to provide a pattern of openings (light transmitting sections). In this mask structure, a phase shifter 403 is provided at one of those adjacent openings and never at the other. Light passing through the phase shifter 403 has its phase turned by $(2m-1)\cdot\pi$ (m: a positive integer) with respect to light passing through the opening where the phase shifter 103 is provided. By doing so, a negative interference occurs between light rays passing through the adjacent openings, so that resolution performance is improved. In the light exposure mask with light shielding films 402 formed on a light transmitting substrate 401 as shown in FIG. 4B, one (for example, 405) of adjacent openings 404, 405 is formed as a groove in the substrate 401 and the other opening is defined on the substrate 401, not in the substrate. In the light exposure mask with light shielding films 402 formed on a light transmitting substrate 401 as shown in FIG. 1C, one (for example, 407) of adjacent openings 406, 407 is formed as a relatively deep groove in the substrate 401 and the other as a relatively shallow groove in the substrate.

The present invention can be applied to any such kinds of masks and specific conditions are imparted to the property of the light shielding film 402.

An explanation will be given below about the results of experiments conducted by the present inventors under illumination conditions of NA=0.52 and a σ=0.3 using a KrF light exposure mask and pattern dimension of 0.15 $\mu$m. The conditions were so set as to obtain a maximal focal depth with the alternative pattern of 0.15 $\mu$m.

The light exposure mask used on experiment was manufactured as set out below. A light shielding film 402 was formed as a CrO/Cr-stacked film on a light transmitting substrate 401, made of quartz, under conditions such that the film 402 had a light shielding property at a light exposure wavelength and had its composition and thickness so adjusted as to have its transmittance and optical path length differ at a light exposure wavelength of 248 nm. A photosensitive resin 401 was coated on the substrate 401 followed by a patterning step. An exposed light shielding film was etched with a diammonium cerium nitrate solution to provide a pattern of the light shielding film 402.

After removing a photosensitive resin film, a photosensitive resin film was again coated and selectively removed so as to correspond to openings. By doing so, one of adjacent openings was not coated with the photosensitive film but the other opening was coated with the photosensitive resin film. Then etching was done with a $CF_4/O_2$-mixed gas. As a result, the substrate 402 was cut by a predetermined depth D at one of the adjacent openings to provide a groove (phase shifting area). This depth D creates a 180° phase difference between light passing through the groove and light passing through the substrate 401 of a corresponding thickness. Thereafter, the photosensitive resin was removed using an etching mask.

The use of the mask caused a fall in light intensity at the site of the groove and, in order to compensate for the fall, the photosensitive film was removed, followed by the etching of the substrate 401 at every opening. This etching was done by a $CF_4/O_2$-mixed gas at the openings of the exposed quartz substrate. By doing so, a groove of a depth D was formed in the substrate 401 at one of the adjacent openings and a groove of a depth 1.95D at the other opening.

Figure 5:
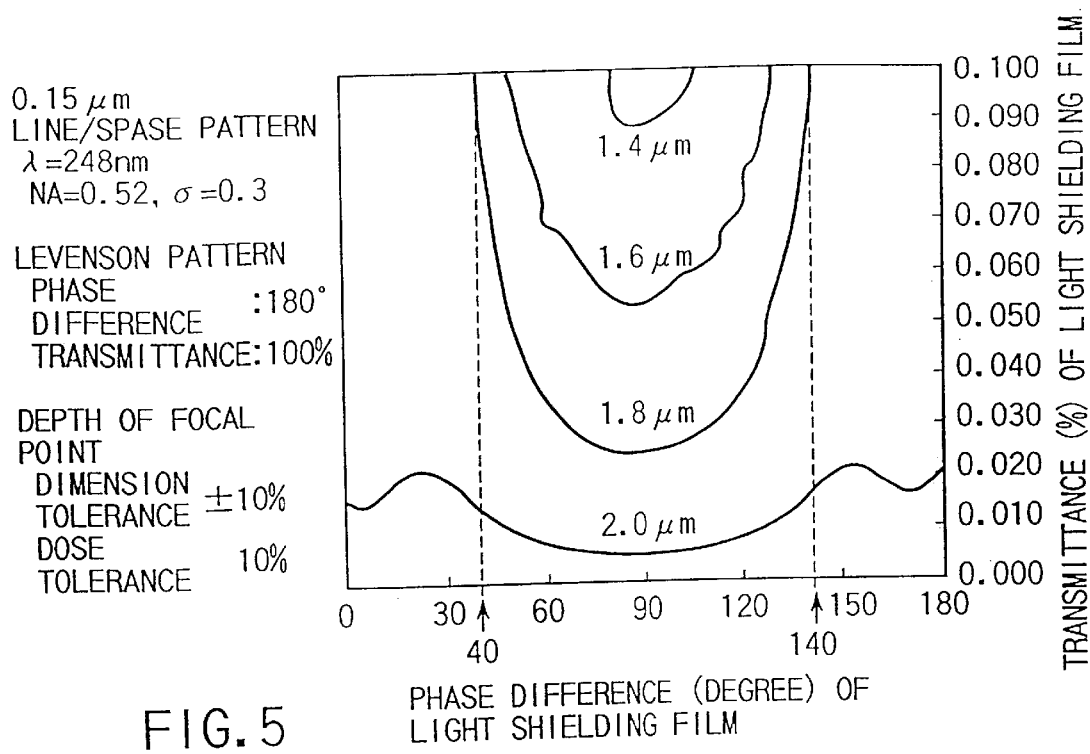
FIG. 5 is a cross-sectional view showing a variation of a focal point tolerance in a light shielding film's transmittance-vs-phase difference plot at a dimension tolerance of ±10%.

Such light exposure masks were manufactured in plural numbers by variously varying the transmittance and phase difference of the light shielding film. Measurement was made on the change of a focal point tolerance for the transmittance and phase difference of the light shielding film. The result of measurement is as shown in FIG. 5. From FIG. 5 it is evident that the focal point tolerance prominently reflects the phase difference of the light shielding film and, upon comparison with the same transmittance value, has a tendency of being the narrowest at a phase of $(n\pm\frac{1}{2})\cdot\pi$ (n: a positive integer) and broadest at a phase of $n\cdot\pi$. Here, the phase difference of the light shielding film means a phase difference between light passing through the light shielding film and light passing through a light transmitting medium (for example, air) equal in thickness to the light shielding film.

As evident from FIG. 5, in order to obtain a focal point tolerance of over 1.8 $\mu$m it is only necessary to make the transmittance of the light shielding film in a range below 0.1% and phase difference of the light shielding film in a range of below 40° or above 140° Although the phase difference is plotted in a range from 0° to 180° on the abscissa, in a range a of $180°\leq a\leq 360°$ reference has only be made to a 360-P position (P: the phase angle). Thus, the phase difference of the light shielding film may be set to be $n\cdot\pi-40°$ to $n\cdot\pi+40°$ (n: a positive integer).

Figure 6:
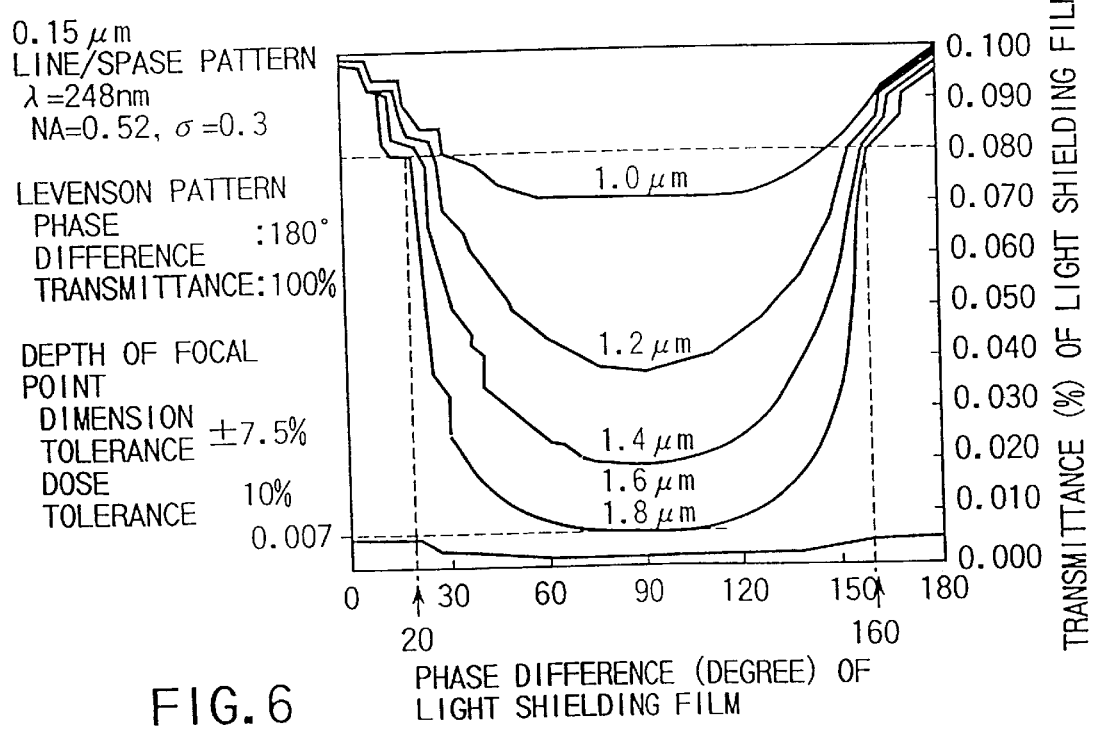
FIG. 6 is a view showing a variation of the focal point tolerance in a light shielding film's transmittance-vs-phase difference plot at a dimension tolerance of ±7.5%.

FIG. 6 shows a focal point tolerance at a dimension tolerance of ±7.5%. If, even in this case, comparison is made in the same transmittance value as at the dimension accuracy of ±10%, it becomes evident that the focal point tolerance is the narrowest at a $(n-\frac{1}{2})\cdot\pi$ (n: a positive integer) and the broadest at $n\cdot\pi$. From FIG. 6 it is evident that, in order to obtain a focal point tolerance of over 1.8 $\mu$m, it may be possible to set the phase difference of the light shielding film in a range below 20° or above 160°, that is, in a range of $n\cdot\pi-20°$ to $n\cdot\pi+20$ (n=a positive integer), at the transmittance of below 0.08%.

Further, when the transmittance of the light shielding film was below 0.007%, it was possible to obtain a focal depth of about 1.8 $\mu$m even where the phase difference of the light shielding film was 90°. This means that, if the transmittance of the light shielding film is set below 0.007%, it is not necessary to consider the phase difference of the light shielding film. This increases the freedom with which the light shielding material is selected.

As evident from FIGS. 5 and 6, as the dimension tolerance becomes smaller, the phase difference becomes smaller with respect to $n\cdot\pi$. Further, the optimal value of the phase of the light shielding film was not dependent upon the exposure light wavelength NA, coherent coefficient, magnification, mask pattern dimension, resist, etc.

According to the present invention, by setting the phase difference of the light shielding film to be about $n\cdot\pi$ and the transmittance of the light shielding film to be below 0.007% it is possible to effectively enlarge the focal point tolerance due to the passage of light through the light shielding film and hence to achieve performance inherent to the alternative phase shifting method. It is also possible to improve the pattern dimension accuracy and manufacturing yield by forming a pattern with the use of the light exposure mask.

An explanation will be given below on the manufacturing method of the light exposure mask of the present embodiment using a KrF excimer laser as an exposure light source. FIGS. 7A to 7E show cross-sectional view showing the method for manufacturing the light exposure mask according to the present embodiment.

Figure 7A:
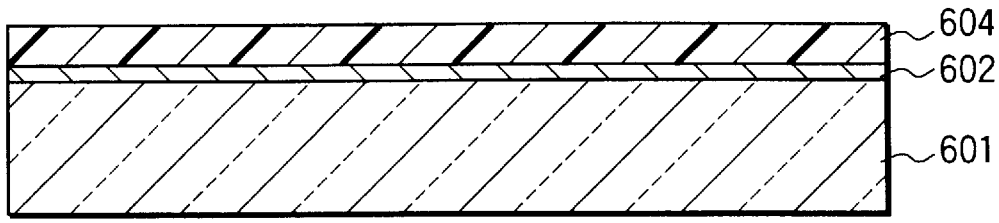
FIGS. 7A, 7B, 7C, 7D and 7E are cross-sectional views showing the process for manufacturing a light exposure mask according to the present invention.

As shown in FIG. 7A, a CrOx film 602 was deposited as a light shielding film on a light transmitting substrate (for example, quartz) by sputtering by a rarefied $Ar/O_2$-mixed gas, while using Cr as a target under a DC bias. The optical constants of the CrOx film 602 were n=2.04 for the refractive index, k=1.15 for the extinction coefficient and 129 nm for the deposited film thickness. A first photosensitive resin film 604 was formed on a resultant mask formation substrate structure.

Figure 7B:
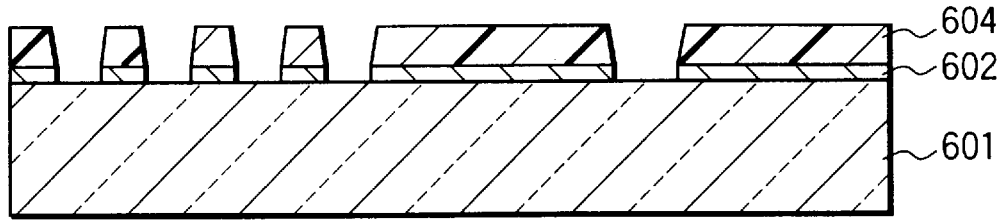

Then as shown in FIG. 7B, in order to form a mask pattern for forming a 0.15 μm pattern on a to-be-formed substrate, a laser drawing was made followed by the effecting of a developing process. By doing so, openings 605 were formed to expose the CrOx film 602. The exposed CrOx film 602 was etched with a diammonium cerium nitrate solution to remove the CrOx film 602.

Figure 7C:
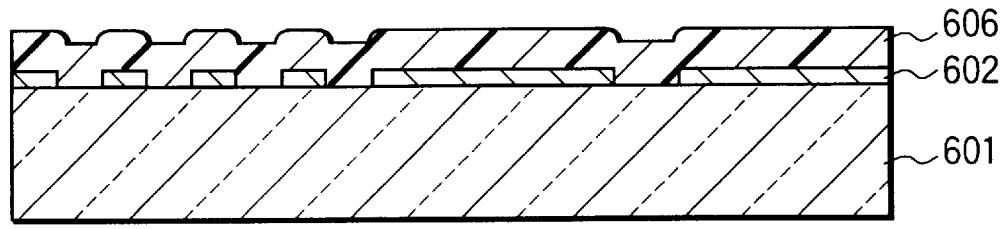

Then as shown in FIG. 7C, the photosensitive resin film 604 which was used as the etching mask material was eliminated followed by the coating of a second photosensitive resin film 606 for forming phase shifting areas on the light transmitting substrate 601.

Figure 7D:
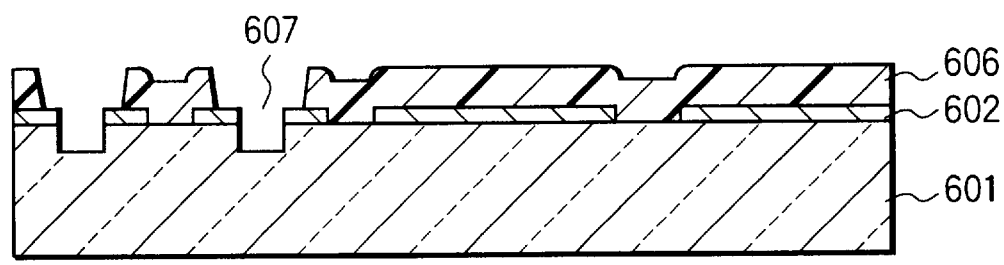

Then as shown in FIG. 7D, a portion 607 of the photosensitive resin 606 was removed and openings 602 were formed in the light shielding film 602 to alternately expose the quartz substrate 601 sections. Etching was effected by $CF_4$ in the exposed quartz substrate 601.

Figure 7E:
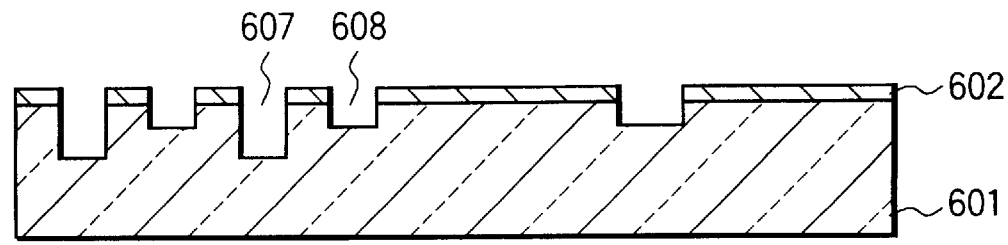

Then as shown in FIG. 7E, the photosensitive resin film 606 was eliminated and the exposed light transmitting substrate was wholly etched to provide a deeper groove 607 and shallower groove 608. The depths of the deeper and shallower grooves 607 and 608 were 474 nm and 234 nm, respectively. Further, the CrOx film adjacent to the deeper groove 607 had a depth of 122 nm while, on the other hand, the CrOx film adjacent to the shallower groove 608 had a depth of 126 nm. The thickness variation of the CrOx film was caused at a time of etching the quartz substrate. The depths of 122 nm and 126 nm were 177° and 183°, respectively. At that time, the transmittance of the light shielding film was about 0.06 to 0.08%.

The following is a result of transferring made with the use of this mask. A 0.3 μm-thick, negative type resist for KrF was formed on a to-be-formed substrate. Using the light exposure mask of a structure as shown in FIG. 7E as a light exposure mask corresponding to a memory gate pattern, a pattern light exposure was made on the substrate under the conditions of NA=0.55 and coherent coefficient of 0.4. After removing those unexposed portions of the negative type resist by a developing step, an underlying substrate was subjected to a pattern formation with a remaining resist pattern used as a mask. A gate pattern was obtained at which time a dimension controllability and focal point tolerance were ±7.5% and 1.2 μm, respectively.

According to the conventional technique, on the other hand, since the phase of light passing through the light shielding film was 99° the dimension controllability was as bad as ±12% when an attempt was made to secure a focal point tolerance of 1.2 μm while the focal point tolerance was only 0.6 μm when an attempt was made to secure a controllability of ±7.5%. By effecting a device fabrication using a light exposure mask manufactured by the present embodiment it was possible to secure an excellent dimension accuracy over a broader defocusing range and hence to fabricate a device of high reliability in terms of a response time, voltage value, current value, etc.

It is preferred that, as in the present embodiment, the thickness of the light shielding film be regulated at the time of etching, taking into consideration a decrease in thickness of the light shielding film caused at the etching step, and a desired phase difference be secured after the light exposure mask has been completed. Further, the CrOx film used in the present embodiment enables a phase difference of 180° to be achieved at a film thickness of 124 nm. By making the light shielding film thinner relative to the deeper groove and thicker relative to the shallower groove as in the present embodiment it was possible to reduce an error against the phase difference of 180°.

Although, in the present embodiment, the material CrOx was used for the light shielding material, it is not restricted thereto and the light shielding material may be of such a type as to enable the composition ratio and film thickness to be adjusted so that the complex index of refraction can be controlled to have an optical path length difference of n·π (n: a positive integer), for the light exposure wavelength, relative to light passing through the adjacent opening of an equal thickness. For example, it is formed of a metal oxide, metal nitride, metal oxynitride, metal fluoride, semiconductor oxide, semiconductor nitride, semiconductor oxynitride, metal semiconductor oxynitride, amorphous carbon, amorphous carbon hydride or amorphous carbon fluoride. Stated in more detail, the light shielding film is formed of CrNx, CrOxNp, SiOx, SiNx, SiOxNy, MoSiOx, MoSiNx, MoSiOxNy, WSiOx, WSiNx, WSiOxNy, CrFx, AlOx, AlNx, AlOxNy, TiOx, TiNy and TiOxNy etc., noting that x, y represent composition rates.

Further, it is not necessarily required that the light shielding film be formed of a single layer structure or a multi-layered structure having different compositions or different materials. Although the light transmitting substrate is formed of quartz in the present embodiment, it is not restricted thereto and, as such, alumina, $CaF_2$, $MgF_2$, etc., can be employed.

Further, the present invention can be applied to a light exposure mask using a wavelength of not only KrF (248 nm) but also F2 (153 nm), mercury's I line (365 nm), etc. An X-ray can also be applied to the light exposure mask. A target pattern line width is not restricted to 0.15 μm on the wafer and may properly be changed according to the specification.

The present invention can also be applied to the light exposure mask using a KrF excimer laser as a light source. This manufacturing method will be explained below.

An SiNx film was deposited as a light shielding film on a light transmitting substrate (quartz) by effecting sputtering by a rarefied $Ar/N_2$-mixed gas while using Si as a target under a DC bias. The optical constants of the SiNx film were n=2.14 for the refractive index k=1.25 for the extinction coefficient and 124 nm for the deposited film thickness.

A photosensitive resin film was formed on the substrate and, in order to form a mask pattern for forming a 0.15 μm pattern on a wafer, a laser drawing was effected, followed by a developing step. Further, an exposed SiNx film was isotropically etched by a $CF_4/O_2$ gas and removed.

Then, the photosensitive resin film was removed and again a photosensitive resin film was formed, followed by a drawing step for forming a phase shifting pattern. An exposed quartz substrate portion is anisotropically etched by a $CF_4$ gas. After the photosensitive resin film has been removed, an exposed light transmitting substrate surface portions are wholly etched to provide deeper and shallower grooves. The deeper and shallower grooves had depths of 474 nm and 234 nm, respectively.

Further, the SiNx film adjacent to the deeper groove and that adjacent to the shallower groove had the thickness of 112 nm and 118 nm, respectively. The change in thickness of the SiNx is caused at the time of etching the quartz substrate. 112 nm and 118 nm of the SiNx film were 175° and 185°, respectively. At this time, the transmittance of the light shielding film was 0.05 to 0.07%.

The following is a result of transferring made using a resultant mask. A 0.3 μm-thick, negative type resist was formed on a to-be-formed substrate. The to-be-formed substrate was subjected to a pattern exposure, under conditions of NA=0.52 and coherent coefficient=0.35, with the use of a light exposure mask of a structure as shown in FIG. 7E as a light exposure mask corresponding to a memory gate pattern. After unexposed portions of the negative type resist were removed by a development step, the underlying substrate was subjected to a pattern formation. By doing so, a gate pattern was obtained at which time the dimension controllability and focal point tolerance were ±7.5% and 1.5 μm, respectively. In the conventional technique, since the phase of light passing through the light shielding film was 99, the dimension controllability was as bad as ±10% when an attempt was made to obtain a focal point tolerance of 1.5 μm and the focal point tolerance was only 0.8 μm when an attempt was made to obtain a dimension controllability of ±7.5%. When the device fabrication was made using the light exposure mask formed according to the present invention, a device of high reliability was obtained in terms of a response time, voltage value, current value, etc., because an excellent dimension accuracy can be secured over a broader defocus range.

It is preferable that, as in the present embodiment, the thickness of the light shielding film be regulated at the time of forming the film, taking into consideration a decrease in thickness of the light shielding film caused at the etching time, and a desirable phase difference be secured after the light exposure mask was completed. Further, the SiNx film used in the present embodiment enables a phase difference of 180° to be achieved at the film thickness of 115 nm. By making the light shielding film thinner relative to the deeper groove and thicker relative to the shallower groove it was possible to reduce an error against a phase difference of 180°.

Although, in the present embodiment, SiNx is used for the light shielding film material, the present invention is restricted thereto and it is possible, in the second embodiment, to use various kinds of materials as set out in connection with the preceding embodiment.

Further, the film structure of the light shielding film, material of the light transmitting substrate, kinds of light exposure masks, light exposure wavelength, etc., can be changed or modified as set out in the second embodiment.

The present invention can be applied to the light exposure mask using an ArF excimer laser as a light source. An explanation will be given below about this manufacturing method.

A CrOx film was deposited, as a light shielding film, on a light transmitting substrate (quartz substrate) by effecting sputtering by a rarefied $Ar/O_2$-mixed gas while using Cr as a target. The optical constants of the CrOx film were n=2.23 for a refractive index, k=1.33 for an extinction coefficient and 88 nm for a deposited film thickness.

A photosensitive resin film was formed on the substrate and, in order to form a mask pattern for forming a 0.1 μm pattern on a wafer, a laser drawing is effected, followed by a developing step. Further, an exposed CrOx film was etched with a diammonium cerium nitrate solution.

Then the photosensitive resin film was removed and again a photosensitive resin film was formed on a resultant surface, followed by the drawing step for forming a phase shifting pattern. The exposed quartz substrate was etched by a CF gas. After the photosensitive resin film was removed, etching was made on an exposed whole surface of the substrate and, at this time, the depths of the deeper and shallower grooves were 361 nm and 178 nm, respectively.

Further, the CrOx film adjacent to the deeper groove had a thickness of 82 nm and that adjacent to the shallower groove a thickness of 85 nm. The thickness variation of the CrOx film was caused by its decrease at a time of etching the quartz substrate. The thicknesses of the CrOx film, that is, 82 nm and 85 nm, correspond to 175° and 183°, respectively. At this time, the transmittance of the light shielding film was in a range of 0.055 to 0.073%.

The following was a result of transferring made with the use of this mask. A 0.3 μm-thick, negative type resist for ArF was formed on a to-be-formed substrate. A pattern light exposure was effected on that substrate, under the conditions of NA=0.61 and coherent coefficient=0.35, with the use of a light exposure mask of a structure as shown in FIG. 7E as a light exposure mask corresponding to a memory gate pattern. After those unexposed portions of the negative type resist were removed by a developing step, an underlying substrate structure was subjected to a pattern formation with the remaining resist pattern used as a mask. For the gate pattern obtained at this time, the controllability and focal point tolerance were ±7.5% and 0.85 μm, respectively.

In the conventional technique, light passing through the light shielding film had a phase of 80° and, at this time, the dimension controllability was as bad as ±10% when an attempt was made to obtain a focal point tolerance of 0.85 μm, while, on the other hand, the focal point tolerance was 0.45 μm when an attempt was made to secure a controllability of ±7.5%. By the effecting of a device fabrication using the light exposure mask prepared according to the present invention, on the other hand, excellent dimension accuracy was able to be secured over a broader defocusing range and it was possible to form a device of high reliability in terms of its response time, voltage current, electric current and so on.

It is preferable that, as in the present embodiment, the film thickness be regulated at a time of forming the film, taking into condition a decrease in depth of the light shielding film caused at a time of etching, and a desired phase difference be set after the light exposure mask was completed. Further, it is possible to achieve a phase difference of 180° on the CrOx film, as in the present embodiment, when the film thickness is 84.5 nm. It is possible, according to the present invention, to decrease an error against 180° by making the film thickness thinner relative to the deeper groove and thicker relative to the shallower groove.

In the present embodiment, although the light shielding film was used for the CrOx film, the present invention is not restricted thereto and use can be made of various kinds of materials as explained in conjunction with the second embodiment. Further, the film structure of the light shielding film, material of the light transmitting substrate, kind of light exposure mask, light exposure wavelength and so on can be variously changed or modified without departing from the spirit and scope of the present invention.

The present invention can also be applied to a light exposure mask using a KrF excimer laser as a light source. The manufacturing method of this light exposure mask will be explained below with reference to FIGS. 8A to 8E.

Figure 8A:
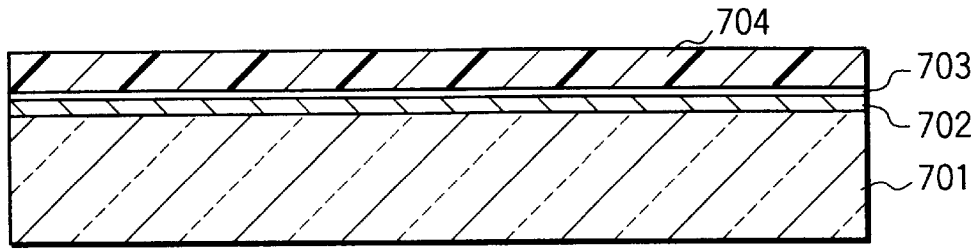
FIGS. 8A, 8B, 8C, 8D and 8E are cross-sectional views showing the process for manufacturing another light exposure mask according to the present invention.

First, as shown in FIG. 8A, an MoSiOx film 702 was deposited as a light shielding film on a light transmitting substrate (quartz substrate) 701 by effecting sputtering by a rarefied Ar/$N_2$-mixed gas while using an MoSi as a target under a CD bias. The optical constants of this MoSiOx film was n=2.14 for the refractive index, k=1.25 for the extinction coefficient and 124 nm for the deposited film thickness. A carbon film 703 was coated on the light shielding film 702, followed by the formation of a first photosensitive resin film 704 on the carbon film. The first photosensitive resin contains a silicon.

Figure 8B:
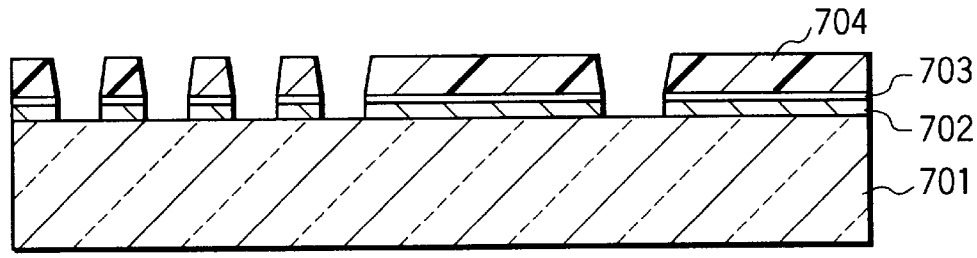

Then as shown in FIG. 8B, in order to form a mask pattern for forming a 0.15 μm pattern on a wafer, a laser drawing was effected, followed by effecting a developing step. By doing so, openings were formed to expose the carbon film 703. The exposed carbon film 703 was removed by an anisotropic etching with the use of an oxygen gas and, further, the underlying MoSiOx film was etched by the anisotropic etching with the use of a $CF_4$ gas.

Figure 8C:
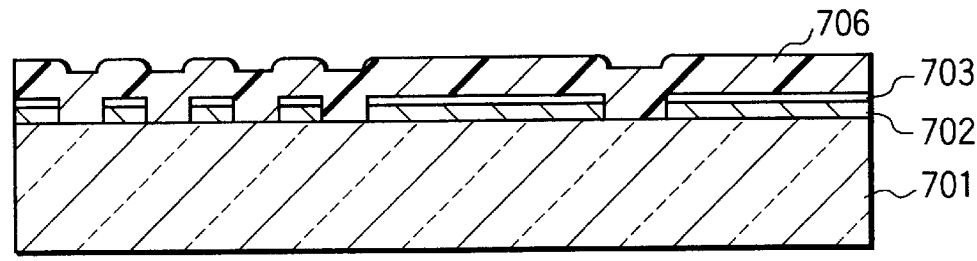

Then as shown in FIG. 8C, after the removal of the photosensitive resin film used as the etching mask, a second photosensitive resin film 706 was provided on a resultant surface in order to form phase shifting sections at the light transmitting substrate 701.

Figure 8D:
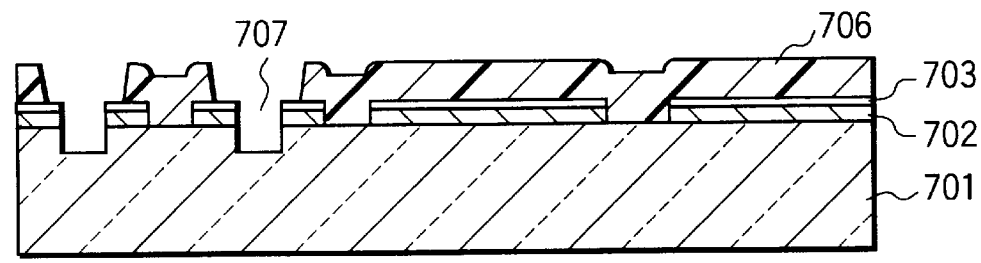

Then as shown in FIG. 8D, a drawing step for forming a phase shifting pattern was effected, followed by a developing step. Sections 707 of the light transmitting substrate and their adjacent light shielding film sections were exposed by that developing step. The exposed quartz substrate portions 701 was anisotropically etched by a $CF_4$ gas.

Figure 8E:
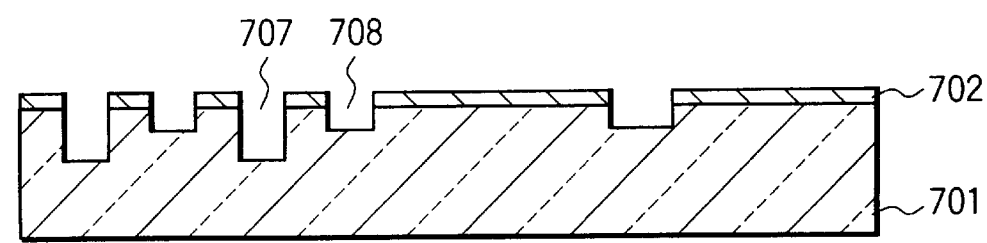

Then as shown in FIG. 8E, the photosensitive resin film 706 was wholly removed and those exposed light emitting substrate portions, in addition to the sections 707, were wholly etched to provide deeper and shallower grooves 707 and 708. It has been found that the deeper and shallower grooves were 474 nm and 234 nm, respectively. Thereafter, the carbon film 703 on the MoSiOx film 702 was removed by an oxygen gas.

According to the present embodiment, during the etching of the quartz substrate 701 the MoSiOx film 702 is protected by the carbon film 703, so that there occurs no decrease in thickness of the MoSiOx. It is, therefore, possible to set the film 702 to a desired thickness. That is, the phase of the MoSiOx film 702 as the light shielding film was maintained to be 180° at any parts of the MoSiOx.

The following is a result of transferring made with the use of this mask. A 0.3 μm-thick negative type resist for KrF was formed on a to-be-formed substrate. That substrate was subjected to a pattern light exposure under the conditions of NA=0.52 and coherent coefficient=0.35 with the use of a light exposure mask of a structure as shown in FIG. 8E as a light exposure mask corresponding to a memory gate pattern. After those unexposed sections of the negative type resist were removed by a developing step, an underlying substrate was subjected to a pattern formation with the use of the remaining pattern as a mask. For a gate pattern obtained at this time, the dimension controllability and focal point tolerance secured were ±7.5% and 1.5 μm, respectively.

For the conventional technique, the phase of light passing through the light shielding film was 99° and the dimension controllability was as bad as ±10% when an attempt has been made to obtain a focal point tolerance of 1.5 μm while, on the other hand, the focal point tolerance was only 0.8 μm when an attempt was made to secure a dimension controllability of ±7.5%. According to the present invention, an excellent dimension accuracy can be secured in a broader defocusing range by performing a device fabrication with the use of the light exposure mask formed according to the present invention. It was able to form a device having high accuracy in terms of its response, voltage value, electric current, etc.

Although, in the above-mentioned embodiment, MoSiOx was used for the light shielding material, the present invention is not restricted thereto and it is possible to use various types of materials as explained in conjunction with the second embodiment. Further, the film structure of the light shielding film, material of the light transmitting substrate, kinds of light exposure mask, light exposure wavelength, etc., can be variously changed or modified as explained in conjunction with the second embodiment.

The present invention can be applied also to a light exposure mask using an ArF excimer laser as a light source. An explanation will be given of the method for manufacturing this mask.

An SiNxOy film was deposited, as a light shielding film, on a light transmitting substrate (quartz substrate) by effecting sputtering, by a rarefied Ar/$N_2$/$O_2$-mixed gas, with Si used as a target. The optical constants of the SiNxOy film was n=2.14 for a refractive index, k=1.25 for an extinction coefficient and 124 nm for a deposited film thickness. A carbon film was formed on the light shielding film.

A silicon-bearing photosensitive resin film was formed on that substrate and, in order to form a mask pattern for forming a 0.1 μm pattern on a wafer, a laser drawing was made, followed by a developing step. A resultant carbon film was removed by an anisotropic etching using an oxygen gas. And the underlying SiNxOy film was removed by an anisotropic etching using $CF_4$.

After removing the photosensitive resin film used as an etching mask, a photosensitive resin film was formed, followed by a drawing step for forming a phase shifting pattern. An exposed quartz substrate was anisotropically etched by a $CF_4$ gas. After removing the photosensitive resin film, etching was wholly made on the exposed light transmitting substrate to form deeper and shallower grooves. At this time, the deeper and shallower grooves had depths of 474 nm and 234 nm, respectively. Finally, the carbon film was removed by etching using an oxygen gas.

According to the present embodiment, during the etching of the quartz substrate, the SiNxOy film is protected by the carbon film, so that there arises no decrease in thickness of the SiNxOy film, that is, the SiNxOy film can be set to a desired thickness at the time of forming that film. In other words, the phase of the SiNxOy film is maintained at 180° over its whole area.

Then, the following is a result of transferring made with the use of this mask. A 0.3 μm-thick negative type resist for ArF was formed on a to-be-formed substrate. This substrate was subjected to a pattern light-exposure, under a condition of NA=0.61 and coherent coefficient=0.35, with the use of a light exposure mask as shown in FIG. 8E as a light exposure mask corresponding to a memory gate pattern. After removing unexposed portions of the negative type resist by a developing step, an underlying substrate was subjected to a pattern formation with the use of the remaining resist pattern as a mask. For a gate pattern obtained at this time it was possible to secure a focal point tolerance of 0.85 µm under a dimension tolerance of ±7.5%.

In the conventional technique, on the other hand, the phase of light passing through a light shielding film was 80° and the light controllability was as bad as ±10% when an attempt was made to obtain a focal point tolerance of 0.85 µm while, on the other hand, the focal point tolerance was only 0.45 µm when an attempt has been made to secure a dimension controllability of ±7.5%. By effecting a device fabrication with the use of an exposure mask prepared according to this invention it was possible to secure an excellent dimension accuracy in a broader defocusing range and hence to form a device having a high reliability in terms of its response time, voltage value, electric current value, etc.

Although, in the present embodiment, the SiNxOy was used for the light shielding material, the present invention is not restricted thereto and it is possible to use various kinds of materials as explained in conjunction with the second embodiment. Further, the film structure of the light shielding film, material of the light transmitting substrate, kinds of light exposure masks, light exposure wavelength, etc., can be variously changed or modified as explained in conjunction with the second embodiment.

The present invention can also be applied to a light exposure mask with the use of an ArF excimer laser as a light source. The following is a method for manufacturing this mask.

A Cr film was deposited, as a light shielding film, on a light shielding substrate (quartz substrate) by effecting sputtering by a rarefied Ar gas with Cr used as a target. The optical constants of the Cr film were n=1.85 for the refractive index, k=2.75 for the extinction coefficient and 20 nm for the deposited film thickness. Then a CrOx film was deposited, as a light shielding film, on the Cr film by effecting sputtering by a rarefied Ar/$O_2$-mixed gas with the Cr as a target. The optical constants of the CrOx film were n=2.73 for the refractive index, k=0.71 for the extinction coefficient and 107 nm for the deposited film thickness. The intensity transmittance and phase obtained at this time relative to the two layers were 0.019% and 360°, respectively. A carbon film was formed on these two films.

A silicon-bearing photosensitive resin film was formed on that substrate structure and, in order to form a mask pattern for forming a 0.1 µm pattern on a wafer, a laser drawing was effected, followed by a developing step. An exposed carbon film was removed by an anisotropic etching using an oxygen gas and, further, an underlying CrOx/Cr film was eliminated by an anisotropic etching using chlorine and oxygen.

After removing the photosensitive resin film used as a mask, a new photosensitive resin film was formed on a surface, followed by a drawing step for forming a phase shift pattern. Exposed quartz substrate sections are anisotropically etched by a $CF_4$ gas. After removing the photosensitive resin film, those exposed light transmitting substrate sections were wholly subjected to etching. At this time, deeper and shallower grooves had depths of 474 nm and 234 nm, respectively. Finally, etching was made by an oxygen gas to eliminate the carbon film.

According to the present embodiment, during the etching of the quartz substrate the CrOx/Cr film is protected by the carbon film, so that there arises no decrease in thickness of the CrOx/Cr film, that is, it is possible to set the CrOx/Cr film to a desired thickness at a time of forming a film. That is, the phase of the CrOx/Cr film was maintained at 180° over any area.

The following is a result of transferring made with the use of this mask. A 0.3 µm-thick negative type resist for ArF was formed on a to-be-formed substrate. This substrate was subjected to a pattern light-exposure under a condition of NA=0.61 and coherent coefficient=0.35 with the use of a light exposure mask of a structure as shown in FIG. 8E as a mask corresponding to a memory gate pattern. After removing non-exposed sections of the negative type resist by a developing step, the underlying substrate structure was subjected to a pattern formation with a remaining resist pattern used as a mask. For a gate obtained at this time it was possible to secure a focal point tolerance of 0.85 µm with a dimension controllability of ±7.5%.

In the conventional technique, the phase of light passing through the light shielding film was 80° and the dimension controllability was as bad as ±10% when an attempt was made to obtain a focal point tolerance of 0.85 µm while, on the other hand, it was not possible to secure a focal point tolerance of only 0.45 µm when an attempt was made to secure a dimension controllability of ±7.5%. By effecting a device fabrication with the use of an exposure mask prepared with the use of the present embodiment, an excellent dimension accuracy can be secured over a broader defocusing range and its was possible to form a device having a high reliability in terms of its response time, voltage value, electric current value, etc.

Although, in the present embodiment, the two CrOx/Cr-layered structure was used for the light shielding material, the present invention is not restricted thereto. For example, a three-layered structure such as a CrOx (50 nm)/Cr (20 nm)/CrOx (57 nm) having a Cr and CrOx film of optical constants the same as those of the present embodiment may be adopted. Further, the materials of the multi-layered structure are not restricted thereto and use can be made of various kinds of materials as explained in conjunction with the second embodiment. Further, the film structure of the light shielding film, materials of the light transmitting substrate, kinds of exposure masks, light exposure wavelength, and so on can be variously changed or modified.

Figure 9A:
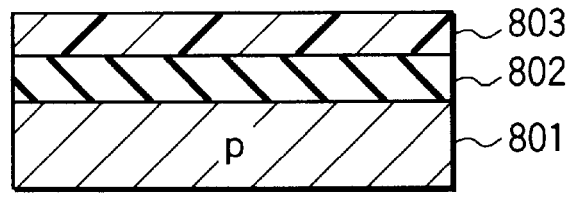
FIGS. 9A, 9B, 9C and 9D show the steps of forming a pattern with the use of the light exposure mask of the present invention.
Figure 9B:
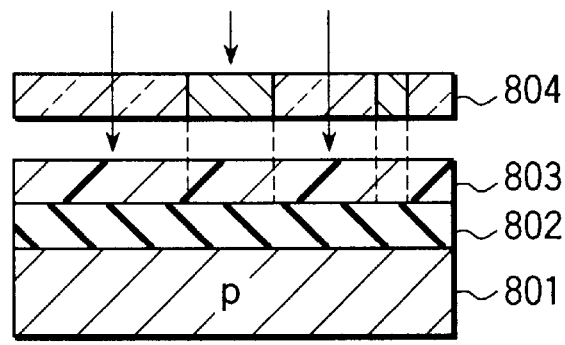
Figure 9C:
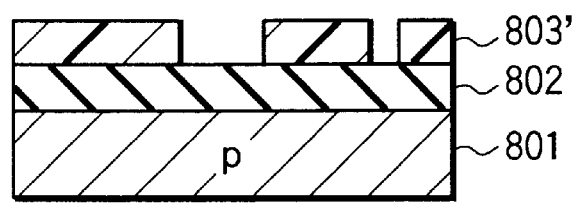
Figure 9D:
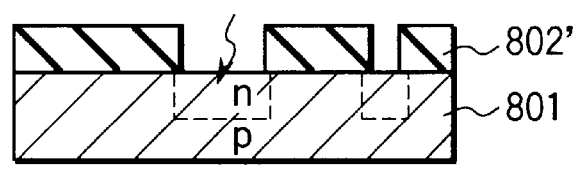

The method for forming a circuit pattern using the above-mentioned light exposure mask will be explained below with reference to FIGS. 9A to 9D. As shown in FIG. 9A, a silicon oxide film 802 is formed on a surface of, for example, a P type silicon substrate 801 and, for example, a negative type resist 803 having a photosensitive property is coated on the silicon oxide film. Light such as ultrasonic radiation is illuminated to the resist 803 through an alternative mask with an adjusted transmittance and phase difference as set out above. Needless to say, the light is so selected as to have a wavelength achieving a phase difference of the above-mentioned light shielding film. Next as shown in FIG. 9C, a development step is done to allow only those lit sections to be left and those not-lit sections to be melted, so that a mask pattern 803' is formed. Then as shown in FIG. 9D, when etching is made with hydrofluoric acid for instance, the silicon oxide film 802 is melted in accordance with the pattern 803' to form a silicon oxide pattern 802'. When this substrate structure is heated in a p type atmosphere, an n type region is formed in accordance with the pattern 802' of the oxide film. After a pn junction has been thus formed, an electrode forming step and so on are done and finally an integrated circuit for instance is manufactured.

The present invention is not restricted to the above-mentioned embodiment and can be variously changed or modified without departing from the spirit and scope of the present invention. Although, in the embodiment, an explanation has been given about the method for forming a light exposure mask and a pattern using the light exposure mask, the present invention can be applied to a mask forming substrate for forming a light exposure mask. In this case, it is only necessary that, as the mask forming substrate, a light shielding film be so formed on a light transmitting substrate as to have a phase difference of substantially n·π (n: a positive integer) relative to light passing through a light transmitting medium the same in thickness as the light shielding film.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A light exposure mask comprising,
   a light transmitting substrate;
   a light shielding film formed on the light transmitting substrate and being patterned to have a plurality of openings; and
   phase shifting means for defining a phase difference of, substantially $(2m-1)\cdot\pi$ (m: a positive integer) between light passing through one of adjacent openings and light passing through the other,
   wherein the light shielding film has such a property as to define a phase difference of substantially n·π (n: a positive integer) between light penetrating the light shielding film and light passing through a light transmitting medium the same in thickness as the light shielding film.

2. A light exposure mask according to claim 1, wherein the light shielding film is formed of a material selected from the group consisting of a metal oxide, metal nitride, metal oxynitride, metal fluoride, semiconductor oxide, semiconductor nitride, semiconductor oxynitride and metal semiconductor oxynitride.

3. A light exposure mask according to claim 2, wherein the light shielding film is formed of a material selected from the group consisting of CrO, CrN, CrON, SiO, SiN, SiON, MoSiN, MoSiON, WSiO, WSiON, CrF, AlO, AlN, AlON, TiO, TiN and TiON.

4. A light exposure mask according to claim 1, wherein the light shielding film has its thickness adjusted to secure a property of said material.

5. A light exposure mask according to claim 3, wherein the light shielding film has a composition ratio of at least one of O, N and F, relative to the other element which is so adjusted as to have a property of said material.

6. A light exposure mask according to claim 3, wherein the light shielding film has its thickness adjusted to obtain a property of said material and has a composition ratio of at least one of O, N and F, relative to the other element, which is adjusted.

7. A light exposure mask according to claim 1, wherein the light shielding film is formed of a material consisting of a material selected from the group consisting of amorphous carbon, amorphous carbon hydride and amorphous carbon fluoride.

8. A light exposure mask according to claim 1, wherein, in order to define the phase shift of substantially $(2m-1)\cdot\pi$, the light transmitting substrate has a groove corresponding to said one opening and no groove corresponding to said other groove.

9. A light exposure mask according to claim 1, wherein, in order to define the phase shift of substantially $(2m-1)\cdot\pi$, the light transmitting substrate has a groove of a first depth corresponding to said one opening and a groove of a second depth corresponding to said other opening.

10. A light exposure mask comprising:
    a light transmitting substrate;
    a light shielding film formed on the light transmitting substrate and being patterned to have a plurality of openings; and
    phase shifting means for defining a phase difference of substantially $(2m-1)\cdot\pi$ (m: a positive integer) between light passing through one of adjacent openings and light passing through the other,
    wherein the light shielding film has a transmittance of below 0.1% and has a property for defining a phase difference of substantially n·π−40° to n·π+40° (n: a positive integer) between light penetrating the shielding film a light passing through a light transmitting medium the same in thickness as the light shielding film.

11. A pattern forming method comprising the steps of:
    forming a photosensitive film on a substrate;
    transferring a pattern of a light exposure mask to the photosensitive film; and
    developing the photosensitive film, wherein
    the light exposure mask comprises a light transmitting substrate, a light shielding film formed on the light transmitting substrate and being patterned to have a plurality of openings and phase shifting means for defining a phase difference of substantially $(2m-1)\cdot\pi$ (m: a positive integer) between light passing through one of adjacent openings and light passing through the other;
    the light shielding film has a property for defining a phase difference of substantially n·π (n: a positive integer), for a specific wavelength, between light penetrating the light shielding film and light passing through a light transmitting medium the same in thickness as the light shielding film; and
    the transferring step is done in a way to allow the photosensitive film to be exposed with light of the specific wavelength.

12. A pattern forming method comprising the steps of:
    forming a photosensitive film on a substrate;
    transferring a pattern of a light exposure mask to the light exposure film; and
    developing the photosensitive film, wherein
    the light exposure mask comprises a light transmitting substrate and a light shielding film formed on the light shielding substrate and being patterned to have a plurality of openings;
    the light shielding film has a property of defining a phase difference of substantially n·π (n: a positive integer), for a specified phase difference, between light penetrating the light shielding film and light passing through a light shielding medium the same in thickness as the light shielding film; and
    the transferring step is done in a way to allow the photosensitive film to be exposed with light of the specific wavelength.

13. A pattern forming method comprising the steps of:
    forming a photosensitive film on a substrate;
    transferring a pattern of a light exposure mask to the photosensitive film; and developing the photosensitive film, wherein the light exposure mask comprises a light transmitting substrate, a light shielding film formed on the light transmitting substrate being patterned to have a plurality of openings and phase shifting means for defining a phase difference of substantially $(2m-1)\cdot\pi$ (m: a positive integer) between light passing through one of adjacent openings and light passing through the other;

the light shielding film has a transmittance of below 0.1% and has a property for defining a phase difference of substantially $n\cdot\pi-40°$ to $n\cdot\pi+40°$ (n: a positive integer), for a specific wavelength, between light penetrating the light shielding film and light passing through a light transmitting medium the equal in thickness as the light shielding film; and the transferring step is done in a manner to allow the photosensitive film to be exposed with light of the specific wavelength.

14. A pattern forming method comprising the steps of:

forming a photosensitive film on a substrate;

transferring a pattern of a light exposure mask to a photosensitive film; and developing the photosensitive film, wherein the light exposure mask comprises a light transmitting substrate, a light shielding film formed on the light shielding substrate and being patterned to have a plurality of openings and phase shifting means for defining a phase difference of substantially $(2m-1)\cdot\pi$ (m: a positive integer) between light passing through one of adjacent openings and light passing through the other;

the light shielding film has a transmittance of below 0.007% and has a property of defining a phase difference of substantially $((2n-1)\cdot\pi)/2$ (n: a positive integer), for a specified light wavelength, between light penetrating the light shielding film and light passing through a light transmitting medium the same in thickness as the light shielding film; and the transferring step is done in a way to allow the photosensitive wavelength to be exposed with the light of the specific wavelength.

* * * * *

UNITED STATES PATENT AND TRADEMARK OFFICE
CERTIFICATE OF CORRECTION

PATENT NO. : 6,030,729
DATED : February 29, 2000
INVENTOR(S) : Shinichi ITO et al.

It is certified that error appears in the above-indentified patent and that said Letters Patent is hereby corrected as shown below:

Title Page, Item [57], in the Abstract, line 11, "an positive" should read --a positive--.

Claim 1, col. 15, line 20, "comprising," should read --comprising:--.

Claim 1, col. 15, line 25, after "of", delete ",".

Signed and Sealed this

Seventeenth Day of April, 2001

NICHOLAS P. GODICI

*Attest:*

*Attesting Officer*   *Acting Director of the United States Patent and Trademark Office*